(12) United States Patent
Cao

(10) Patent No.: US 9,564,454 B2
(45) Date of Patent: Feb. 7, 2017

(54) TFT ARRAY SUBSTRATE, DISPLAY PANEL AND DISPLAY DEVICE

(71) Applicants: Shanghai Tianma Micro-Electronics Co., Ltd., Shanghai (CN); Tianma Micro-Electronics Co., Ltd., Shenzhen (CN)

(72) Inventor: Zhaokeng Cao, Shanghai (CN)

(73) Assignees: SHANGHAI TIANMA MICRO-ELECTRONICS CO., LTD., Shanghai (CN); TIANMA MICRO-ELECTRONICS CO., LTD., Shenzhen (CN)

(*) Notice: Subject to any disclaimer, the term of this patent is extended or adjusted under 35 U.S.C. 154(b) by 0 days.

(21) Appl. No.: 14/228,203

(22) Filed: Mar. 27, 2014

(65) Prior Publication Data

US 2015/0097190 A1 Apr. 9, 2015

(30) Foreign Application Priority Data

Mar. 7, 2014 (CN) .......................... 2014 1 0083641

(51) Int. Cl.
*H01L 27/12* (2006.01)
*G09G 3/3266* (2016.01)
(Continued)

(52) U.S. Cl.
CPC ........... *H01L 27/124* (2013.01); *G09G 3/3266* (2013.01); *G09G 3/3677* (2013.01);
(Continued)

(58) Field of Classification Search
CPC .. H01L 27/1214; H01L 27/124; G02F 1/1368; G02F 1/13452; G02F 1/13454; G09G 3/3648; G09G 3/3659; G09G 3/3266; G09G 3/3674; G09G 3/3677; G09G 3/3681; G09G 2320/0233
See application file for complete search history.

(56) References Cited

U.S. PATENT DOCUMENTS

| 5,081,687 | A | * | 1/1992 | Henley | ............... | G01R 31/316 345/87 |
| 6,115,020 | A | * | 9/2000 | Taguchi | ............... | G09G 3/3648 345/671 |

(Continued)

FOREIGN PATENT DOCUMENTS

| CN | 1363919 A | 8/2002 |
| CN | 101447177 B | 6/2011 |

(Continued)

OTHER PUBLICATIONS

Office Action as issued in corresponding German Application No. 102014205311.0, dated May 23, 2016.

*Primary Examiner* — Fernando L Toledo
*Assistant Examiner* — Christine L Hagan
(74) *Attorney, Agent, or Firm* — Alston & Bird LLP

(57) ABSTRACT

A TFT array substrate having compensated gate signal delays is disclosed. The TFT array substrate includes a plurality of gate lines, a plurality of data lines insulatedly intersecting with the plurality of the gate lines, and a plurality of TFT switches, each of which is connected with one of the gate lines and one of the data lines. The TFT array substrate also includes a plurality of driving units, where the driving units are located at both ends of the gate lines, and each of the driving units is connected with at least one gate line to drive the TFT switches connected to the at least one gate line.

14 Claims, 6 Drawing Sheets

(51) Int. Cl.
*G09G 3/36* (2006.01)
*G09G 3/32* (2016.01)

(52) U.S. Cl.
CPC ............. *G09G 2310/0218* (2013.01); *G09G 2320/0223* (2013.01); *G09G 2320/0233* (2013.01); *G09G 2320/0247* (2013.01); *G09G 2320/0252* (2013.01)

(56) References Cited

U.S. PATENT DOCUMENTS

| | | | | |
|---|---|---|---|---|
| 6,407,729 | B1* | 6/2002 | Moon | G09G 3/3622 345/204 |
| 7,015,886 | B2* | 3/2006 | Matsuyama | G09G 3/367 345/101 |
| 7,133,034 | B2* | 11/2006 | Park | G09G 3/3648 345/100 |
| 7,253,863 | B2* | 8/2007 | Ono | G02F 1/133345 349/139 |
| 7,375,716 | B2* | 5/2008 | Toriumi et al. | 345/99 |
| 7,978,274 | B2* | 7/2011 | Umezaki | H01L 27/12 349/139 |
| 7,999,776 | B2* | 8/2011 | Li | G09G 3/3677 345/100 |
| 8,531,366 | B2* | 9/2013 | Hu | G02F 1/136286 345/204 |
| 8,957,839 | B2* | 2/2015 | Hu | G02F 1/136286 345/204 |
| 9,251,754 | B2* | 2/2016 | Ma | G09G 3/3674 |
| 9,305,508 | B2* | 4/2016 | Park | G09G 3/34 |
| 2001/0026257 | A1* | 10/2001 | Kimura | G09G 3/3225 345/87 |
| 2003/0020702 | A1* | 1/2003 | Matsuyama | 345/204 |
| 2005/0078260 | A1* | 4/2005 | Ono et al. | 349/141 |
| 2005/0168491 | A1* | 8/2005 | Takahara | G09G 3/006 345/690 |
| 2006/0022900 | A1* | 2/2006 | Miyake | G09G 3/3266 345/55 |
| 2006/0038501 | A1* | 2/2006 | Koyama | G09G 3/3216 315/169.3 |
| 2008/0123005 | A1 | 5/2008 | Sohn et al. | |
| 2008/0204619 | A1* | 8/2008 | Saitou | G02F 1/136204 349/43 |
| 2009/0303232 | A1* | 12/2009 | Moon | G09G 3/003 345/419 |
| 2012/0140424 | A1* | 6/2012 | Sato | G02F 1/167 361/749 |
| 2012/0169678 | A1 | 7/2012 | Shin | |
| 2012/0281160 | A1 | 11/2012 | Ono et al. | |
| 2014/0071361 | A1* | 3/2014 | Lv | G02F 1/13306 349/33 |
| 2014/0218274 | A1* | 8/2014 | Yamashita | G09G 3/3677 345/84 |
| 2015/0002382 | A1* | 1/2015 | Cao | G09G 3/3677 345/92 |
| 2015/0371598 | A1* | 12/2015 | So | G09G 3/20 345/212 |
| 2016/0180817 | A1* | 6/2016 | Cho | G09G 3/20 345/213 |

FOREIGN PATENT DOCUMENTS

| | | | | |
|---|---|---|---|---|
| CN | 102955310 A | | 3/2013 | |
| CN | 103400559 A | * | 11/2013 | ........... G09G 3/3677 |
| CN | WO 2015014030 A1 | * | 2/2015 | ........... G09G 3/3677 |
| DE | 102009038862 A1 | | 6/2010 | |
| KR | 1020040019708 | | 6/2005 | |
| KR | GB 2464789 A | * | 5/2010 | ........... G02F 1/1345 |

* cited by examiner

--Prior art--

--Prior art--

US 9,564,454 B2

TFT ARRAY SUBSTRATE, DISPLAY PANEL AND DISPLAY DEVICE

CROSS-REFERENCES TO RELATED APPLICATIONS

This application claims the benefit of priority to Chinese Patent Application No. 201310464559.5, filed with the Chinese Patent Office on Oct. 7, 2013, and Chinese Patent Application No. 201410083641.8, filed with the Chinese Patent Office on Mar. 7, 2014, the contents of which are incorporated herein by reference in their entirety.

TECHNICAL FIELD

The present invention relates to the field of display technologies, and in particular to a Thin Film Transistor (TFT) array substrate with a compensated gate signal delay, a display panel and a display device.

TECHNICAL BACKGROUND

So far, flat panel displays such as Liquid Crystal Displays (LCDs) and Organic Light Emitting Diode (OLED) displays are popular in the present display market due to their advantages like a small volume, a light weight, a less thickness, low power consumption, low radiation. To display an image, each pixel in a flat panel display is driven by a Thin Film Transistor integrated in a TFT array substrate, so that the image is displayed in combination with peripheral driving circuitry. The Thin Film Transistors, which are switches for controlling the light emitting of the pixels, are essential for the LCD or the OLED display. To meet the increasingly demanding requirements for a narrowed frame and a better display effect of the flat panel display, it's necessary for those skilled in the art to narrow the frame of the flat panel display while improving the display effect of the flat panel display by compensating the gate signal delay.

SUMMARY OF THE INVENTION

One inventive aspect is a TFT array substrate having compensated gate signal delays. The TFT array substrate includes a plurality of gate lines, a plurality of data lines insulatedly intersecting with the plurality of the gate lines, and a plurality of TFT switches, each of which is connected with one of the gate lines and one of the data lines. The TFT array substrate also includes a plurality of driving units located at both ends of the gate lines, where each of the driving units is connected with at least one gate line to drive the TFT switches connected to the at least one gate line. The TFT array substrate also includes a plurality of compensation units located at both ends of the gate lines, where each of the compensation units is connected with a corresponding one gate line to drive the TFT switches connected thereto.

Another inventive aspect is a display panel, including a TFT array substrate having compensated gate signal delays. The TFT array substrate includes a plurality of gate lines, a plurality of data lines insulatedly intersecting with the plurality of the gate lines, and a plurality of TFT switches, each of which is connected with the gate line and the data line. The TFT array substrate also includes a plurality of driving units located at both ends of the gate lines, where each of the driving units is connected with at least one gate line to drive the TFT switches connected to the at least one gate line. The TFT array substrate also includes a plurality of compensation units located at both ends of the gate lines, where each of the compensation units is connected with a corresponding one gate line to drive the TFT switches connected thereto.

Another inventive aspect is a display device, including a TFT array substrate having compensated gate signal delays. The TFT array substrate includes a plurality of gate lines, a plurality of data lines insulatedly intersecting with the plurality of the gate lines, and a plurality of TFT switches, each of which is connected with one of the gate lines and one of the data lines. The TFT array substrate also includes a plurality of driving units located at both ends of the gate lines, where each of the driving units is connected with at least one gate line to drive the TFT switches connected to the at least one gate line. The TFT array substrate also includes a plurality of compensation units located at both ends of the gate lines, where each of the compensation units is connected with a corresponding one gate line to drive the TFT switches connected thereto.

DESCRIPTION OF DRAWINGS

In order to more clearly illustrate the technical solutions of the embodiments of the invention, the drawings used for the description of the embodiments are briefly introduced below. Obviously, the drawings for the following description only show some embodiments of the invention, and other drawings may also be obtained from the described drawings by those skilled in the art without any creative work.

DETAILED DESCRIPTION OF THE PREFERRED EMBODIMENT

Figure 1:
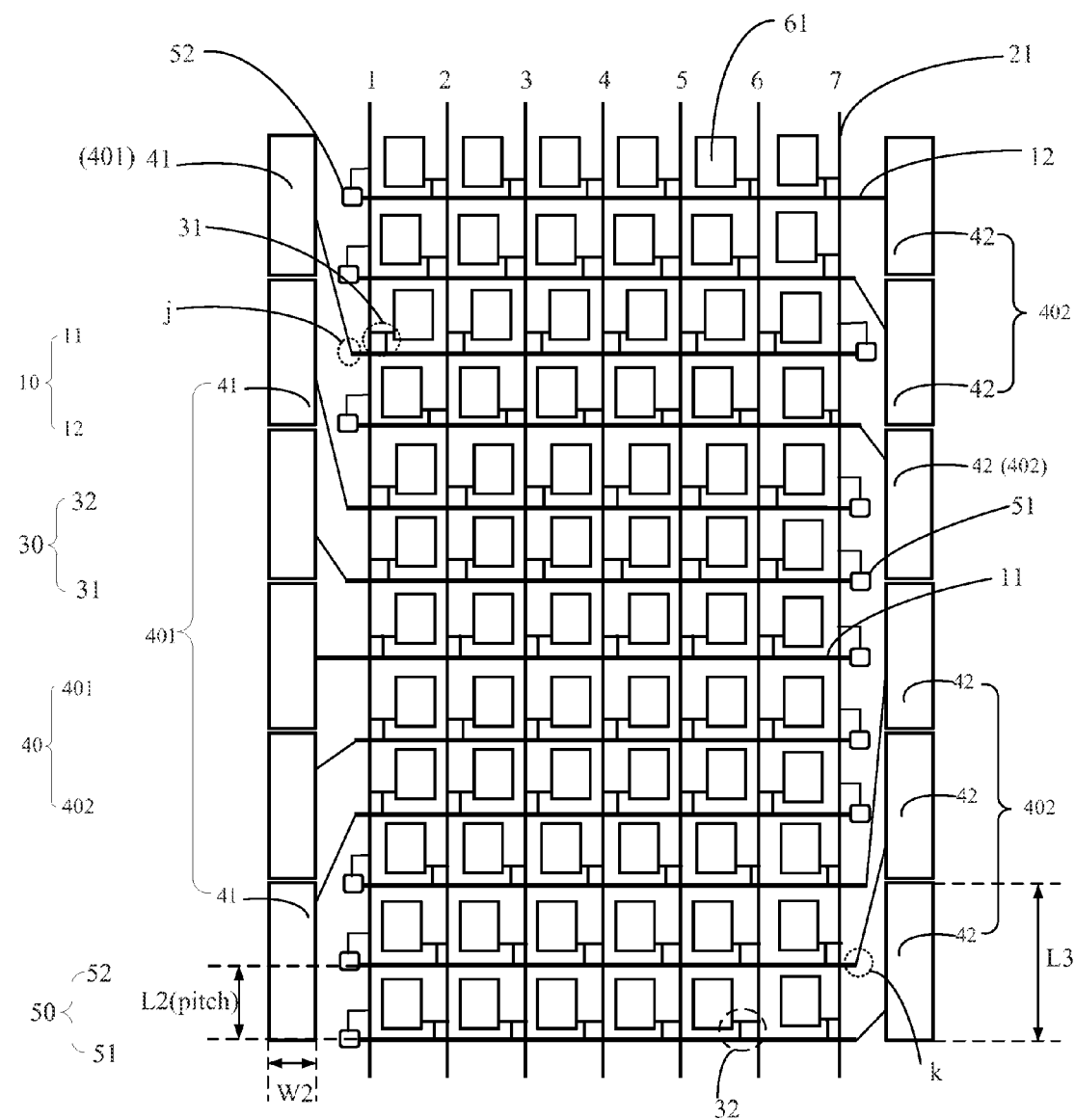
FIG. 1 is a schematic diagram showing the structure of a TFT array substrate according to a first embodiment of the invention.

To make objects, features and advantages of the present invention more apparent, the solution is further described below in combination with the drawings and embodiments.

It is noted that specific details are illustrated for the description below for better understanding of the present invention. However, the present invention can be implemented in various ways other than those described herein, and deductions and modifications may be made by those skilled in the art without departing from the concept of the invention. Therefore, the present invention is not limited to the specific embodiments disclosed herein.

One embodiment of the invention provides a TFT array substrate which includes a plurality of gate lines 10, a plurality of data lines 21 insulatedly intersecting with the gate lines 10, a plurality of TFT switches 30 each of which is connected with both a gate line and a data line, a plurality of driving units 40, and a plurality of compensation units 50. The driving units 40 are located at both ends of the gate lines 10, and each driving unit 40 is connected with at least one gate line 10 to drive the TFT switch 30. The compensation units 50 are located at both ends of the gate lines 10 and are connected with at least one gate line 10 to output a compensation signal for compensating a gate signal delay.

As shown in FIG. 1, one embodiment of the invention provides an illustrative example of a TFT array substrate. For example, the TFT array substrate includes 12 gate lines 10, which include two groups of first gate lines and three groups of second gate lines, where the group of first gate lines are arranged adjacent to the group of second gate lines. These two groups of first gate lines include 6 first gate lines 11, while these three groups of second gate lines include 6 second gate lines 12. Each of the first gate line 11 and the second gate line 12 includes a first end j and a second end k, as shown in FIG. 1, the first ends j of the first gate lines 11 are located at the same side of the gate lines 10, i.e. the left side of the gate lines 10, with the first ends j of the second gate lines 12, and both the second ends k of the first gate lines 11 and the second ends k of the second gate lines 12 are located at the right side of the gate lines 10. It is noted that, both the first ends j of the first gate lines 11 and the first ends j of the second gate lines 12, although described illustratively as being located at the left side of the gate lines 10 in the present embodiment, may be located at the right side of the gate lines 10 in other embodiments, in this case, both the second ends k of the first gate lines 11 and the second ends k of the second gate lines 12 are located at the left side of the gate lines 10.

The TFT array substrate further includes 7 data lines 21, i.e. the 1st to 7th data lines 21 arranged along a direction from the first end j to the second end k of the gate line 10, each data line 21 insulatedly intersects with all the gate lines 10, and regions enclosed by the data lines 21 and the gate lines 10 define pixel units.

The TFT array substrate further includes a plurality of driving units 40 located at both ends of the gate lines 10, and each of the driving units 40 is connected with at least one gate line 10 to drive the TFT switch 30.

The driving units 40 include two groups of first driving units 401 connected to the groups of first gate lines, and three groups of second driving units 402 connected to the groups of second gate lines.

Particularly, the two groups of first driving units 401 include 6 first driving units 41 connected to the first ends j of the first gate lines 11, respectively; and the three groups of second driving units 402 include 6 second driving units 42 connected to the second ends k of the second gate lines 12, respectively.

Herein, the number of the first driving units 41 in each group of first driving units 401 is equal to that of the first gate lines 11 connected with the first driving units 41; while the number of the second driving units 42 in each group of second driving units 402 is equal to that of the second gate lines 12 connected with the second driving units 42. For example, as shown in FIG. 1, one of those two groups of first driving units 401 includes merely one first driving unit 41, thus only one first gate line 11 is connected with this first driving unit 41; and the other of those two groups of first driving units 401 includes five first driving units 41, thus there are five first gate lines 11 connected with these five first driving units 41. Likewise, a first one of those three groups of second driving units 402 includes two second driving units 42, thus there are two second gate lines 12 connected with these two second driving units 42, and so on, which will not be further described in detail below.

The TFT array substrate further includes a plurality of compensation units 50, which include two groups of first compensation units and three groups of second compensation units. The groups of first compensation units are connected with the groups of first gate lines to output compensation signals to the groups of first gate lines, and the groups of second compensation units are connected with the groups of second gate lines to output compensation signals to the groups of second gate lines.

Particularly, the two groups of first compensation units include 6 first compensation units 51 connected to the second ends k of the first gate lines 11, respectively, to output the compensation signals to the second ends k of the first gate lines 11; and the three groups of second compensation units include 6 second compensation units 52 connected to the first ends j of the second gate lines 12, respectively, to output the compensation signals to the first ends j of the second gate lines 12.

The first compensation unit 51 is further connected with a data line 21 closest to it, i.e. the 7th data line 21, to receive a compensation signal and then transfer the compensation signal to the first gate line 11; while the second compensation unit 52 is further connected with a data line closest to it, i.e. the 1st data line 21, to receive a compensation signal and then transfer the compensation signal to the second gate line 12.

Figure 2:
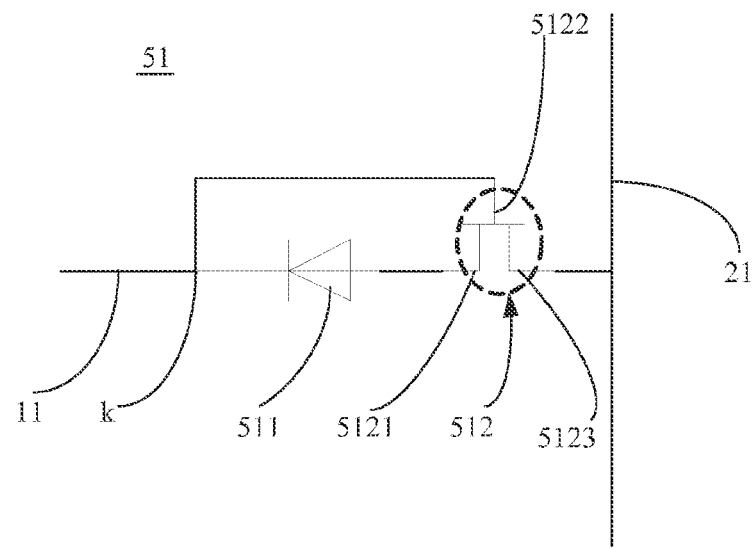
FIG. 2 is a schematic diagram showing the structure of a first compensation unit according to an embodiment of the invention.

In addition, as shown in FIG. 2, the first compensation unit 51 includes a first diode 511 and a first compensation TFT switch 512. A current output end of the first diode 511 is connected with the second end k of the first gate line 11, the source 5121 of the first compensation TFT switch 512 is connected with a current input end of the first diode 511, the gate 5122 of the first compensation TFT switch 512 is connected with the current output end of the first diode 511, and the drain 5123 of the first compensation TFT switch 512 is connected with the 7th data line 21 to receive the signal from the 7th data line 21.

Figure 3:
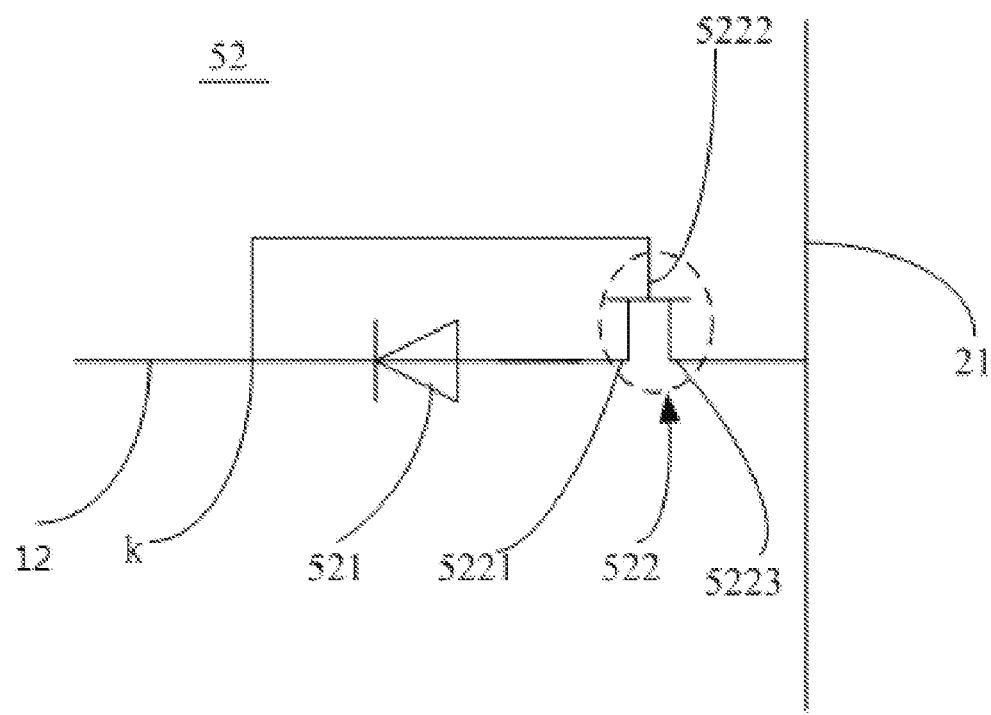
FIG. 3 is a schematic diagram showing the structure of a second compensation unit according to an embodiment of the invention.

Similarly, as shown in FIG. 3, the second compensation unit 52 includes a second diode 521 and a second compensation TFT switch 522. A current output end of the second diode 521 is connected with the first end j of the second gate line 12, the source 5221 of the second compensation TFT switch 522 is connected with a current input end of the second diode 521, the gate 5222 of the second compensation TFT switch 522 is connected with the current output end of the second diode 521, and the drain 5223 of the second compensation TFT switch 522 is connected with the 1st data line 21 to receive the signal from the 1st data line 21.

Figure 4:
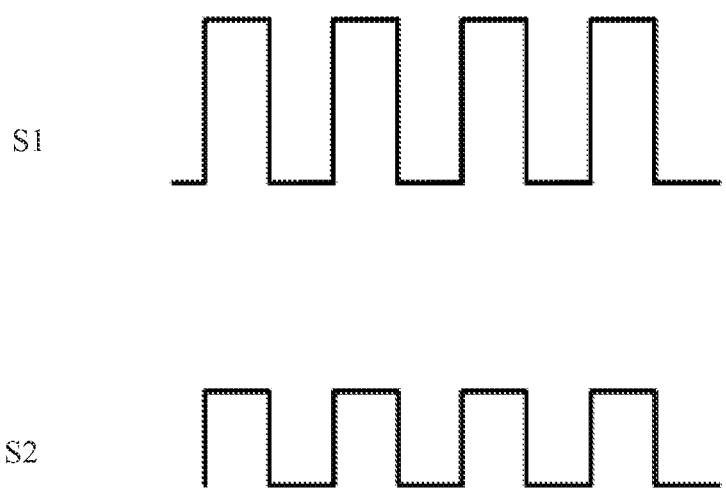
FIG. 4 shows waveforms of signals outputted from data lines according to an embodiment of the invention.

As shown in FIG. 4, each of the 1st and 7th data lines 21 outputs a first pulse signal S1 having a high voltage level in a range from 12V to 25V and a low voltage level in a range from −5V to 5V. Each of the 2nd to 6th data lines 21 (that is to say, except for the data line closest to the first compensation unit 51 and the data line closest to the second compensation unit 52) outputs a second pulse signal S2 having a high voltage level in a range from 0V to 5V and a low voltage level in a range from −5V to 0V. The first pulse signal S1 and the second pulse signal S2 share the same cycle.

The TFT array substrate further includes a plurality of TFT switches 30 connected with both the gate lines 10 and the data lines 21. The TFT switches 30 include first TFT switches 31 connected with the first gate lines 11 and second TFT switches 32 connected with the second gate lines 12, where the sources of the first TFT switches 31 are connected with the 1st to 6th data lines 21, respectively; and the sources of the second TFT switches 32 are connected with the 2nd to 7th data lines 21, respectively.

Pixel electrodes 61 are connected with drains (not shown) of the TFT switches 30. That is, the pixel electrodes 61 are connected with either the drains (not shown) of the first TFT switches 31 or the drains (not shown) of the second TFT switches 32, to receive signals from the drains of the first TFT switches 31 or the second TFT switches 32.

It is noted that the number of the gate lines, the number of the groups of first gate lines, the number of the groups of second gate lines, the number of the first gate lines 11, the number of the second gate lines 12, the number of the data lines 21, the numbers of the first and second driving units, and the numbers of the first and second compensation units are illustrative instead of limiting in the first embodiment, that is, the number of the gate lines, the number of the groups of first gate lines, the number of the groups of second gate lines, the number of the first gate lines 11, the number of the second gate lines 12, the number of the data lines 21, and the numbers of the first and second driving units are not limited in this embodiment of the invention, and may be properly and selectively configured by those skilled in the art as actually desired.

In the present embodiment, the compensation units are configured to compensate the gate signal delays, thereby reducing the gate signal delays, alleviating flicker, and improving the display effect of the flat panel display.

Due to the TFT array driven at both lateral sides thereof described as above, the frame of the flat panel display may be narrowed and the power consumption of the flat panel display may be decreased through embodiment of the invention for reasons as follows.

Figure 5A:
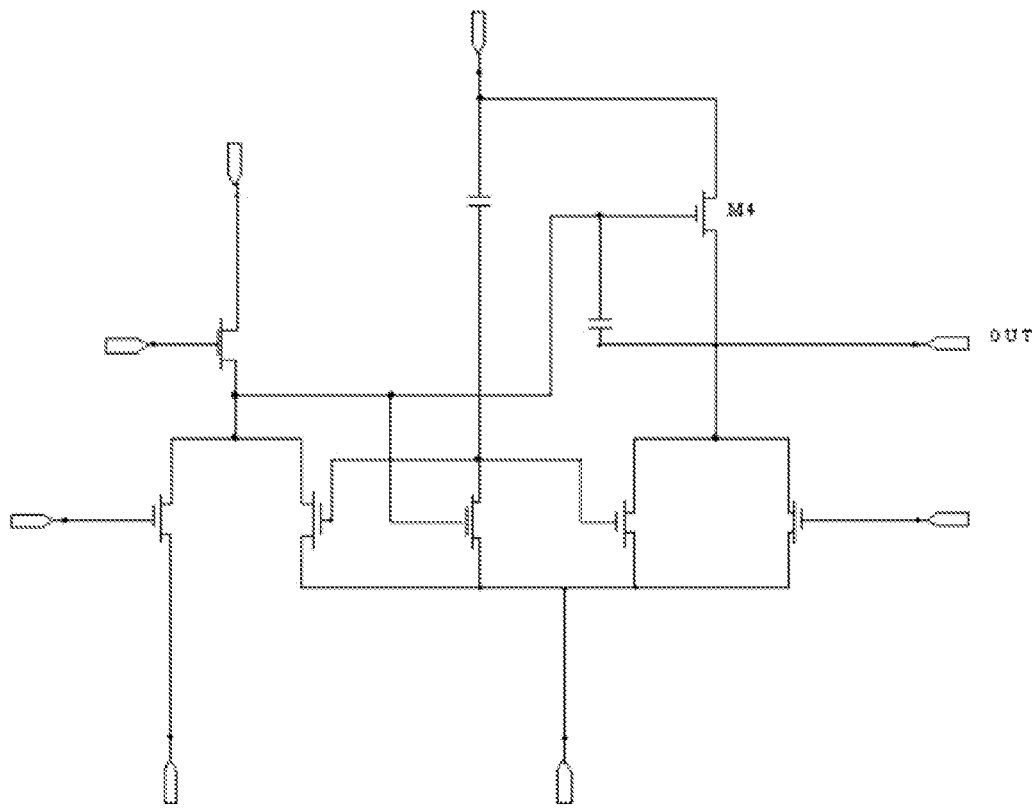
FIG. 5A is a schematic diagram showing the structure of a gate driver known in the prior art.

Firstly, FIG. 5a is a schematic diagram showing the structure of a gate driver known in the prior art. As shown in FIG. 5a, the driving unit in the prior art is generally a gate driver located at a frame area (namely a non-display area). The gate driver includes a pull-up driving transistor M4, a signal is output from an output end OUT of the gate driver to a gate line to drive a TFT (namely to turn on the gate of the TFT switch or to achieve the connection of the drain and the source of the TFT switch), and the output capability of the gate driver (namely the driving capability of the driving unit) depends on the area of the pull-up driving transistor M4. A larger area of the pull-up driving transistor M4 means a stronger output capability of the gate driver and a lower possibility of occurrence of signal delays on the gate lines (i.e. a lower possibility of occurrence of signal delays on the gates of the TFT switches at a display area); while a less area of the pull-up driving transistor M4 means a weaker output capability of the gate driver and a higher possibility of occurrence of signal delays on the gate lines (i.e. a higher possibility of occurrence of signal delays on the gates of the TFT switches at the display area), resulting in flicker and degrading the display quality. Therefore, in the prior art, the area of the pull-up driving transistor M4 is large enough to avoid the declining of output capability of the gate driver, as a result, the width of the frame of the flat panel display is greater due to the large area of the pull-up driving transistor M4. That is, because the TFTs are driven by signals output by gate drivers only in the prior art, the width of the frame of the flat panel display is greater due to the large area of the gate driver (which mainly depends on the area of the pull-up driving transistor M4).

In the embodiment of the invention, however, the compensation units are introduced so that both the gate drivers and the compensation units may output signals to the gate lines to drive the TFTs (namely to turn on the gate of the TFT switch or to achieve the connection of the drain and the source of the TFT switch), instead of the manner in the prior where only the gate drivers output signals to the gate lines to drive the TFTs. Thus, the area of the pull-up driving transistor M4 may be reduced without changing the overall signal outputted by both the gate driver and the compensation unit to the gate line, i.e. without changing the overall signal received by the gate line, so that the area of the gate driver may be reduced to narrow the frame of the flat panel display.

Figure 5B:
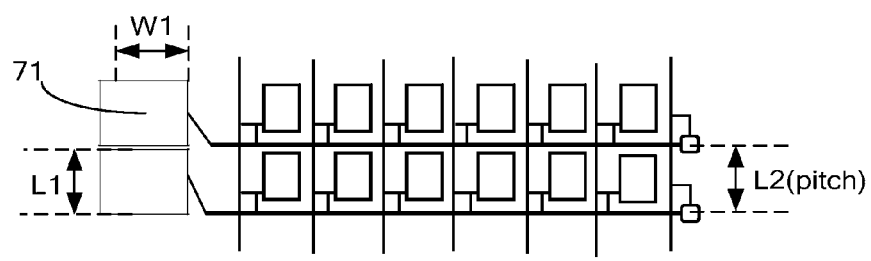
FIG. 5B is a schematic diagram showing the structure of a TFT array substrate in the prior art.

Secondly, in the existing TFT array substrate with compensated gate signal delays in the prior art as shown in FIG. 5b, each driving unit 71 has a length L1 equal to a length L2 (i.e. a pitch) of a pixel unit in the direction of the data line 21, and has a width W1.

While in the embodiment of the invention, the TFT array is driven at its both lateral sides. As shown in FIG. 1, each of the first driving units 41 and the second driving units 42 has a length across two pixel rows, that is, the length L3 of the driving unit is twice the length L2 of the pixel unit in the direction of the data line 21. Further referring to FIG. 1 in combination with FIGS. 5a and 5b, the length L3 of each driving unit (41, 42) of the embodiment of the invention is twice the length L1 of the driving unit 71 in the prior art, that is, the width W2 of the driving unit (41, 42) of the embodiment of the invention is a half of the width W1 of the driving unit 71 in the prior art, without reducing the output capability of the gate driver (i.e. without changing the TFT area). Therefore, with the TFT array with compensated gate signal delays that is driven at its both lateral sides, the length of each driving unit (41, 42) is prolonged and the width of the driving unit (41, 42) is narrowed, so that the width of the gate driver is narrowed and hence the frame of the flat panel display may be narrowed. Furthermore, the TFT array that is driven at its both lateral sides in the embodiment of the invention enables a dot reversing effect by reversing the columns of the pixel units, thereby reducing the power consumption and improving the display quality.

As such, the compensation units are configured to compensate gate signal delays in the present embodiment, thereby reducing the gate signal delays, alleviating flicker, and improving the display effect of the flat panel display; further, the area of the gate driver (i.e. driving unit) is reduced to narrow the frame of the flat panel display. Moreover, with the TFT array that is driven at its both lateral sides, the frame of the flat panel display may be narrowed or the power consumption of the flat panel display may be reduced in the embodiment of the invention.

By partially modifying the TFT array substrate in the first embodiment, another embodiment of the invention further provides a second embodiment which is different from the first embodiment in that the number of first gate lines in any group of first gate lines is equal to the number of second gate lines in any group of second gate lines. The similarity of the second embodiment with the first embodiment is not described again herein.

Figure 6:
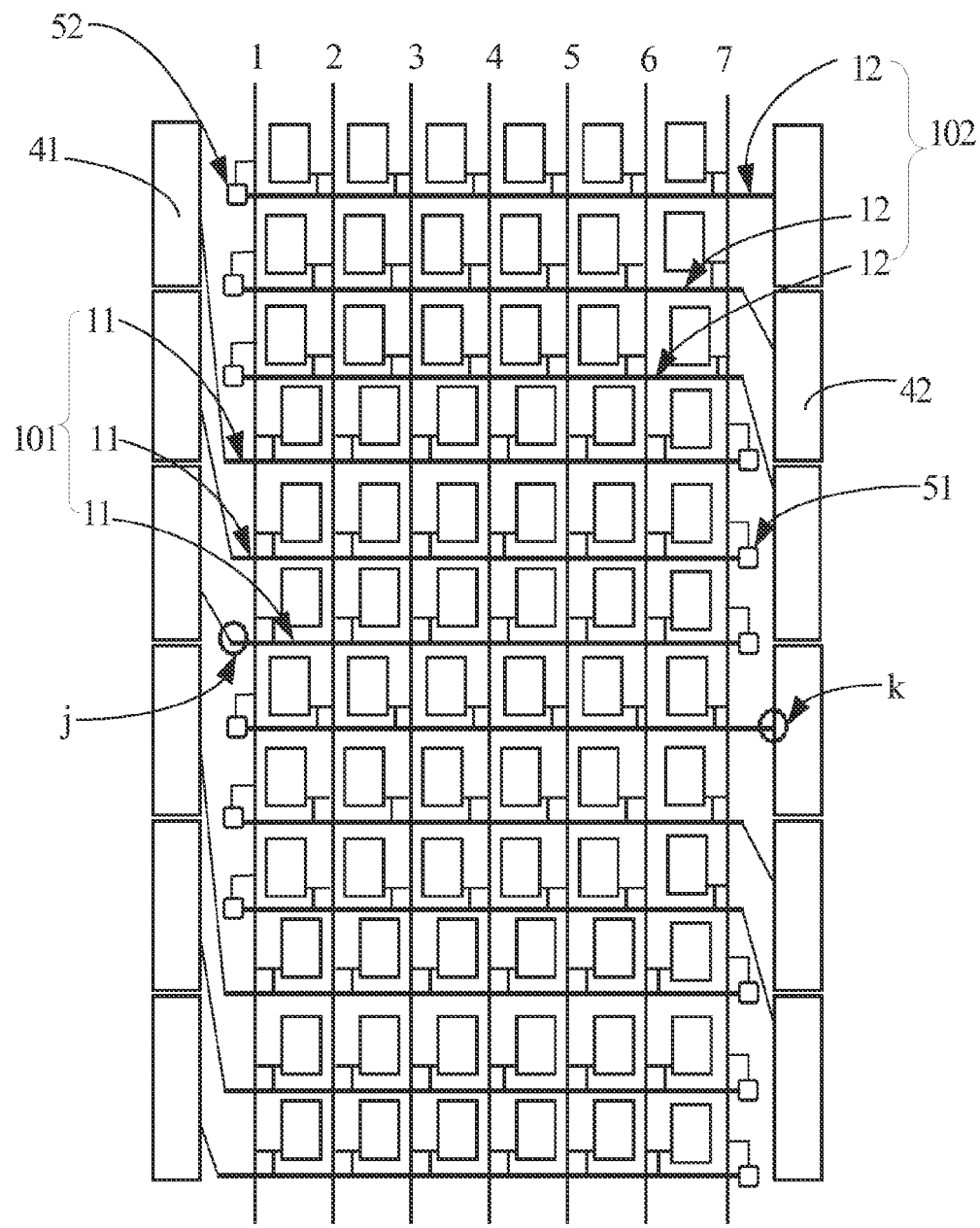
FIG. 6 is a schematic diagram showing the structure of a TFT array substrate according to a second embodiment of the invention.

Particularly, as shown in FIG. 6, the TFT array substrate illustrated in the second embodiment includes two groups of first gate lines 101 and two groups of second gate lines 102. The groups of first gate lines 101 are arranged alternately with respect to the groups of second gate lines 102. Each group of first gage lines 101 includes three first gate lines 11, while each group of second gage lines 102 includes three second gate lines 12. Therefore, the number of first gate lines 11 in any group of first gate lines 101 is equal to the number of second gate lines 12 in any group of second gate lines 102.

Figure 7:
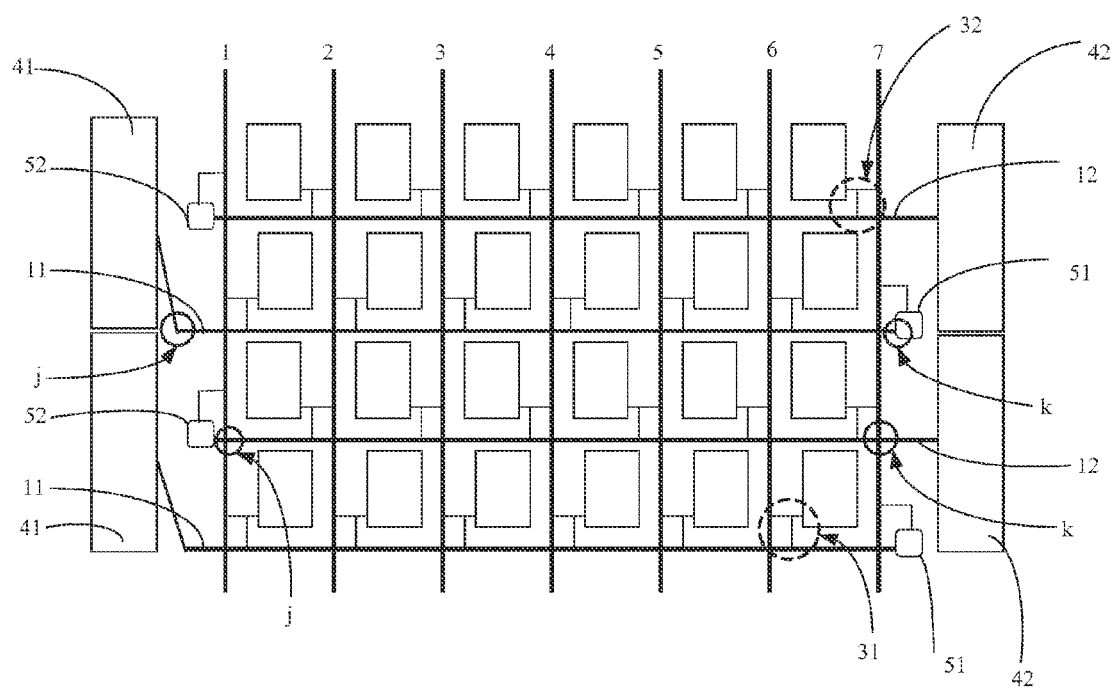
FIG. 7 is a schematic diagram showing the structure of another TFT array substrate according to the second embodiment of the invention.

It is noted that the number of the gate lines, the number of the groups of first gate lines, the number of the groups of second gate lines, the number of the first gate lines 11 in each group of first gate lines, the number of the second gate lines 12 in each group of second gate lines, the numbers of the first and second driving units, and the numbers of the first and second compensation units are illustrative instead of limiting in the second embodiment. In other embodiments, as shown in FIG. 7 for example, a TFT array substrate includes four gate lines which include two groups of first gate lines 101 and two groups of second gate lines 102; each group of first gate lines 101 includes one first gate line 11 and each group of second gate lines 102 includes one second gate line 12, and the groups of first gate lines 101 are arranged alternately with respect to the groups of second gate lines 102.

The number of the gate lines, the number of the first gate lines 11, the number of the second gate lines 12, the number of the data lines 21, and the numbers of the first and second driving units are not limited in the embodiment of the invention, and may be properly and selectively configured by those skilled in the art as actually desired.

Referring to FIGS. 6 and 7 again, the first driving units 41 are connected with first ends j of the first gate lines 11, respectively, and the first compensation units 51 are connected with second ends k of the first gate lines 11, respectively, to output compensation signals to the second end k of the first gate lines 11. The second driving units 42 are connected with second ends k of the second gate lines 12, respectively, and the second compensation units 52 are connected with first ends j of the second gate lines 12, respectively, to output compensation signals to the first end j of the second gate lines 12.

As such, the compensation units are configured to compensate gate signal delays in the present embodiment, thereby reducing the gate signal delays, alleviating flicker, and improving the display effect of the flat panel display; further, the area of the gate driver (i.e. driving unit) is reduced to narrow the frame of the flat panel display. Moreover, with the TFT array that is driven at its both lateral sides, the frame of the flat panel display may be narrowed or the power consumption of the flat panel display may be reduced in the invention.

Another embodiment of the invention further provides a display panel (not shown) which includes a TFT array substrate and a color filter substrate arranged opposite to the TFT array substrate. The TFT array substrate is any one of those described in the above embodiments. Generally, the display panel is a Liquid Crystal Display panel which further includes liquid crystal layer disposed between the TFT array substrate and the color filter substrate. Moreover, the display panel is not limited to the Liquid Crystal Display panel, and may be a touch panel, a OLED display panel or E-book for example.

Another embodiment of the invention further provides a display device (not shown) which includes a TFT array substrate, and the TFT array substrate may be any one of those described in the above embodiments. Generally, the display device is a Liquid Crystal Display device, and further includes a color filter substrate, liquid crystal layer and a backlight module which are located at a side of the TFT array substrate, where the color filter substrate and the TFT array substrate are arranged opposite to each other, the liquid crystal layer are located between the TFT array substrate and the color filter substrate, and the backlight module is located at the other side of the TFT array substrate. Moreover, the display device is not limited to the Liquid Crystal Display device, and may be an OLED device, for example.

It is noted that the TFT array substrate may be manufactured by an amorphous silicon-based process, a low-temperature polycrystalline silicon-based process, or an oxide-based process, which are well known in the art and are not described again herein.

As such, in the TFT array substrate, the display panel and the display device disclosed in the embodiments of the invention, the compensation units are configured to compensate the gate signal delays and the TFT array is driven at its both lateral sides, thereby reducing the gate signal delays, alleviating flicker, improving the display effect of the flat panel display, narrowing the frame of the flat panel display, and reducing the power consumption of the flat panel display.

Although the invention has been described as above, various alterations and modifications may be made on the invention by those skilled in the art without departing from the concept and scope of the invention. Therefore, if all these alterations and modifications fall within the scope of the invention and equivalents thereof, the invention is interpreted as containing these alterations and modifications.

What is claimed:

1. A TFT array substrate having compensated gate signal delays, the TFT array substrate comprising:
   a plurality of gate lines, each of which having a first end and a second end and coupled to N thin film transistor (TFT) switches, wherein the plurality of gate lines comprise a plurality of first gate lines and a plurality of second gate lines;
   N+1 data lines intersecting with the plurality of gate lines;
   a plurality of first driving units located at peripheries of the first ends of the plurality of gate lines;
   a plurality of second driving units located at peripheries of the second ends of the plurality of gate lines;
   a plurality of first compensation units located at peripheries of the first ends of the plurality of gate lines and coupled to the first of the N+1 data lines;
   a plurality of second compensation units located at peripheries of the second ends of the plurality of gate lines and coupled to the (N+1)th of the N+1 data lines;
   wherein the first end of each of the plurality of first gate lines is connected to an associated one of the plurality of first driving units, the second end of each of the plurality of first gate lines is connected to an associated one of the plurality of second compensation units,
   the first end of each of the plurality of second gate lines is connected to an associated one of the plurality of first compensation units, the second end of each of the plurality of second gate lines is connected to an associated one of the plurality of second driving units, and
   N TFT switches coupled to each of the plurality of first gate lines are connected to the N+1 data lines excluding the (N+1)th, and N TFT switches coupled to each of the plurality of second gate lines are connected to the N+1 data lines excluding the first.

2. The TFT array substrate of claim 1, wherein the first gate lines and the second gate lines are equal in number.

3. The TFT array substrate of claim 2, wherein the first gate lines and the second gate lines are arranged in an alternating sequence.

4. The TFT array substrate of claim 1, wherein
the plurality of first driving units, the plurality of second compensation units and the plurality of first gate lines are equal in number, and the plurality of second driving units, the plurality of first compensation units and the plurality of second gate lines are equal in number.

5. The TFT array substrate of claim 1, wherein
each of the plurality of first compensation units comprises a first diode and a first compensation TFT switch, a source electrode of the first compensation TFT switch is electrically connected to a current input end of the first diode, a gate electrode of the first compensation TFT switch is electrically connected to a current output end of the first diode, the current output end of the first diode is connected to the first end of the associated one of the plurality of first gate lines, and a drain electrode of the first compensation TFT switch is connected with the first of the N+1 data lines.

6. The TFT array substrate of claim 1, wherein
each of the plurality of second compensation units comprises a second diode and a second compensation TFT switch, a source electrode of the second compensation TFT switch is electrically connected to a current input end of the second diode, a gate electrode of the second compensation TFT switch is electrically connected to a current output end of the second diode, the current output end of the second diode is connected to the second end of the associated one of the plurality of second gate lines, and a drain electrode of the second compensation TFT switch is connected with the (N+1)th of the N+1 data lines.

7. The TFT array substrate of claim 1, wherein one of the first and the (N+1)th of the N+1 data lines outputs a first pulse signal having a high voltage level in a range from 12V to 25V and a low voltage level in a range from −5V to 5V.

8. The TFT array substrate of claim 7, wherein,
each of the N+1 data lines, excluding the first one or the (N+1)th one, outputs a second pulse signal having a high voltage level in a range from 0V to 5V and a low voltage level in a range from −5V to 0V.

9. The TFT array substrate of claim 8, wherein when one of the first and the (N+1)th of the N+1 data lines outputs the first pulse signal, the other one of the first and the (N+1)th of the N+1 data lines outputs the second pulse signal.

10. The TFT array substrate of claim 1, wherein,
each of the plurality of first driving units comprises a first driving TFT, and each of the plurality of second driving units comprises a second driving TFT.

11. The TFT array substrate of claim 1, wherein each of the plurality of first gate lines receives a gate signal from the associated one of the plurality of first driving units and a compensation signal from the associated one of the plurality of second compensation units, and each of the plurality of second gate lines receives a gate signal from the associated one of the plurality of second driving units and a compensation signal from the associated one of the plurality of first compensation units.

12. The TFT array substrate of claim 1, wherein source electrodes, of N TFT switches coupled to each of the plurality of first gate lines, are connected to the N+1 data lines excluding the (N+1)th, source electrodes, of N TFT switches coupled to each of the plurality of second gate lines, are connected to the N+1 data lines excluding the first.

13. A display panel, comprising:
a TFT array substrate and a color filter substrate opposite to the TFT array substrate, wherein the TFT array substrate comprises:
a plurality of gate lines, each of which having a first end and a second end and coupled to N thin film transistor (TFT) switches, wherein the plurality of gate lines comprise a plurality of first gate lines and a plurality of second gate lines;

N+1 data lines intersecting with the plurality of gate lines;

a plurality of first driving units located at peripheries of the first ends of the plurality of gate lines;

a plurality of second driving units located at peripheries of the second ends of the plurality of gate lines;

a plurality of first compensation units located at peripheries of the first ends of the plurality of gate lines and coupled to the first of the N+1 data lines;

a plurality of second compensation units located at peripheries of the second ends of the plurality of gate lines and coupled to the (N+1)th of the N+1 data lines;

wherein the first end of each of the plurality of first gate lines is connected to an associated one of the plurality of first driving units, the second end of each of the plurality of first gate lines is connected to an associated one of the plurality of second compensation units, the first end of each of the plurality of second gate lines is connected to an associated one of the plurality of first compensation units, the second end of each of the plurality of second gate lines is connected to an associated one of the plurality of second driving units, N TFT switches coupled to each of the plurality of first gate lines are connected to the N+1 data lines excluding the (N+1)th, and N TFT switches coupled to each of the plurality of second gate lines are connected to the N+1 data lines excluding the first.

14. A display device, comprising:
a TFT array substrate having compensated gate signal delays, wherein the TFT array substrate comprises:
a plurality of gate lines, each of which having a first end and a second end and coupled to N thin film transistor (TFT) switches, wherein the plurality of gate lines comprise a plurality of first gate lines and a plurality of second gate lines;

N+1 data lines intersecting with the plurality of gate lines;

a plurality of first driving units located at peripheries of the first ends of the plurality of gate lines;

a plurality of second driving units located at peripheries of the second ends of the plurality of gate lines;

a plurality of first compensation units located at peripheries of the first ends of the plurality of gate lines and coupled to the first of the N+1 data lines;

a plurality of second compensation units located at peripheries of the second ends of the plurality of gate lines and coupled to the (N+1)th of the N+1 data lines;

wherein the first end of each of the plurality of first gate lines is connected to an associated one of the plurality of first driving units, the second end of each of the plurality of first gate lines is connected to an associated one of the plurality of second compensation units, the first end of each of the plurality of second gate lines is connected to an associated one of the plurality of first compensation units, the second end of each of the plurality of second gate lines is connected to an associated one of the plurality of second driving units, N TFT switches coupled to each of the plurality of first gate lines are connected to the N+1 data lines excluding the (N+1)th, and N TFT switches coupled to each of the plurality of second gate lines are connected to the N+1 data lines excluding the first.

* * * * *